United States Patent [19]
Levy et al.

[11] 3,944,825
[45] Mar. 16, 1976

[54] METHOD AND APPARATUS FOR THE SEPARATION OF ISOTOPES

[75] Inventors: Richard H. Levy, Boston; George Sargent Janes, Lincoln, both of Mass.

[73] Assignee: Jersey Nuclear-Avco Isotopes, Inc., Bellevue, Wash.

[22] Filed: Feb. 2, 1973

[21] Appl. No.: 328,953

Related U.S. Application Data

[63] Continuation-in-part of Ser. No. 25,605, March 25, 1970, Pat. No. 3,772,519.

[52] U.S. Cl. .............. 250/282; 250/283; 250/288; 204/157.1 R
[51] Int. Cl.² ........................................ H01J 39/34
[58] Field of Search ...... 204/155, 157.1 R; 250/527, 250/528, 282, 283, 288

[56] References Cited
UNITED STATES PATENTS

3,443,087   5/1969   Robieux et al. ............... 204/157.1 R
3,772,519   11/1973   Levy et al. ........................ 250/290

*Primary Examiner*—Howard S. Williams
*Attorney, Agent, or Firm*—Weingarten, Maxham & Schurgin

[57] ABSTRACT

In a system for isotope enrichment, method and apparatus for separating particles of one isotope type from an environment containing particles of plural isotope types by ionizing the particles of said one isotope type and imparting to the electrons released from the ionized particles an energy substantially in excess of the thermal or background energy of the environment whereby these super energetic electrons expand away from the environment in the company of the corresponding ionized particles or trajectories substantially different from those of the remaining particles in the environment to permit separate collection of the particles of the one isotope type.

41 Claims, 5 Drawing Figures

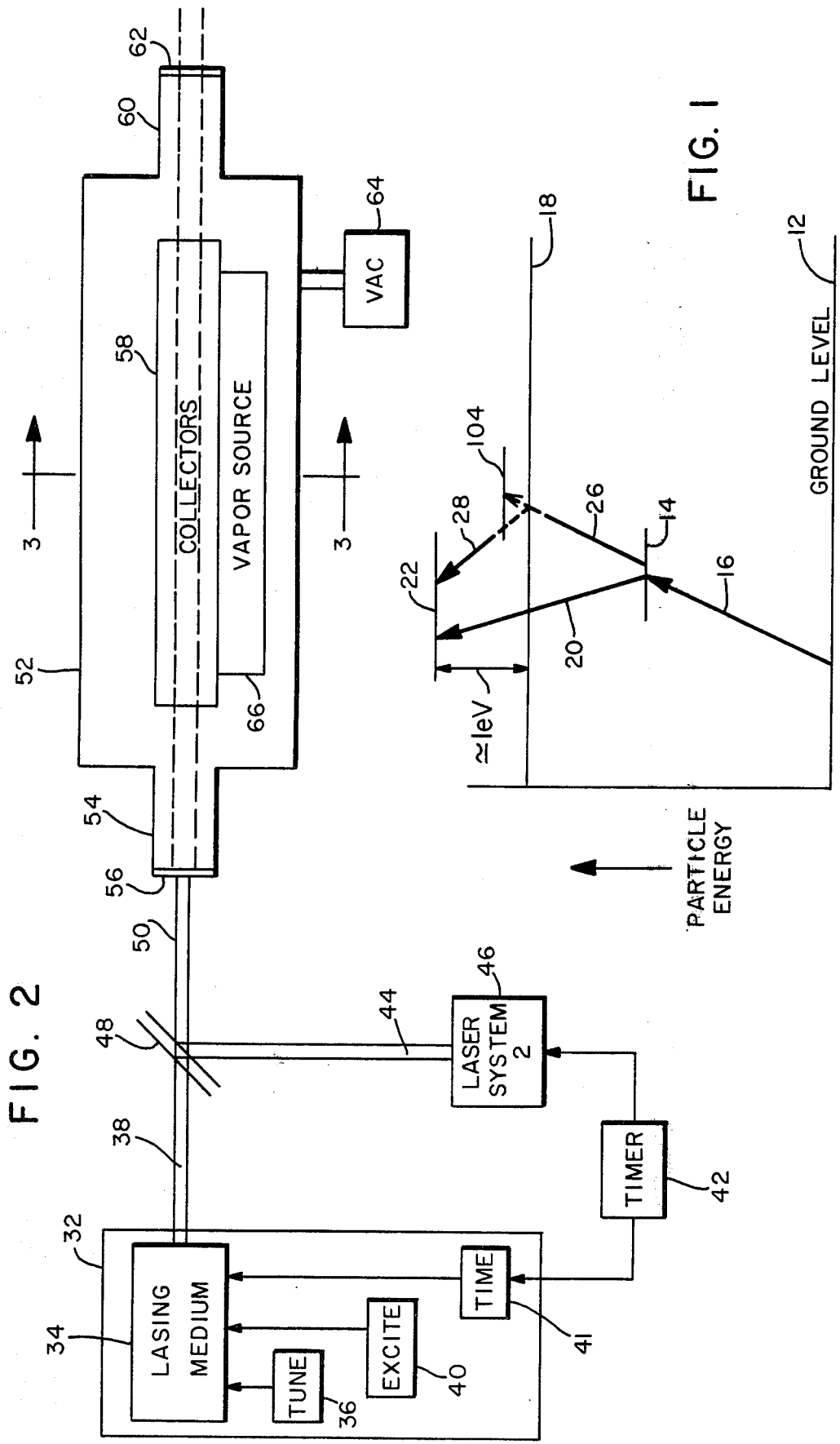

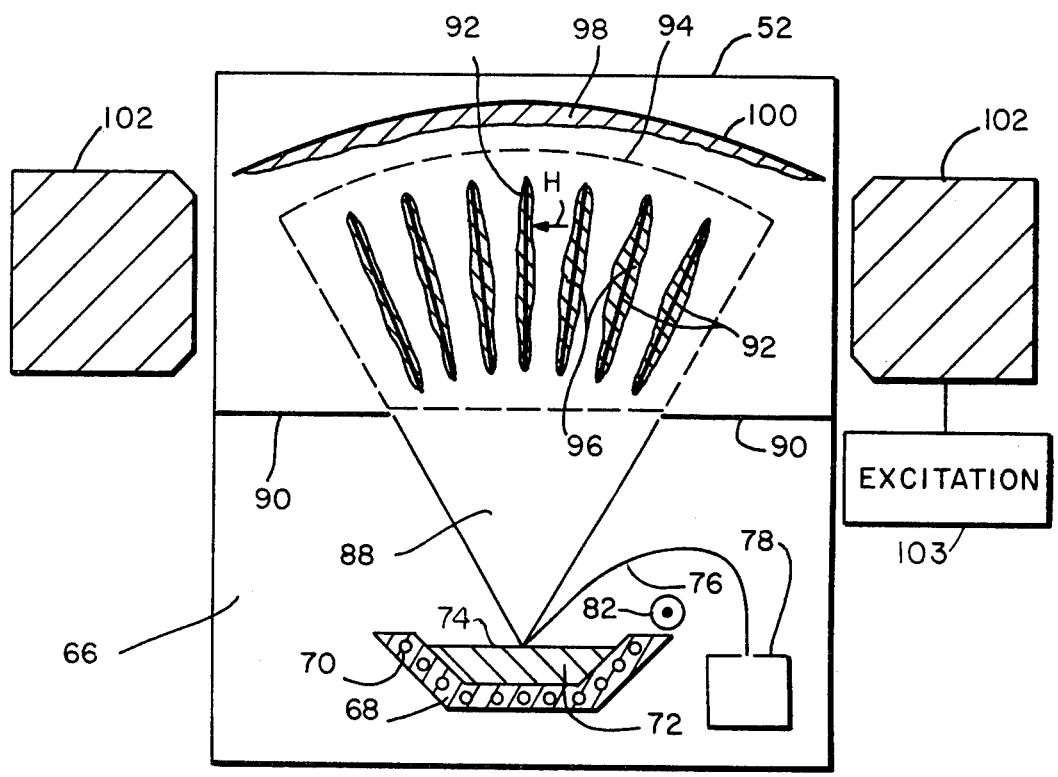
FIG. 3
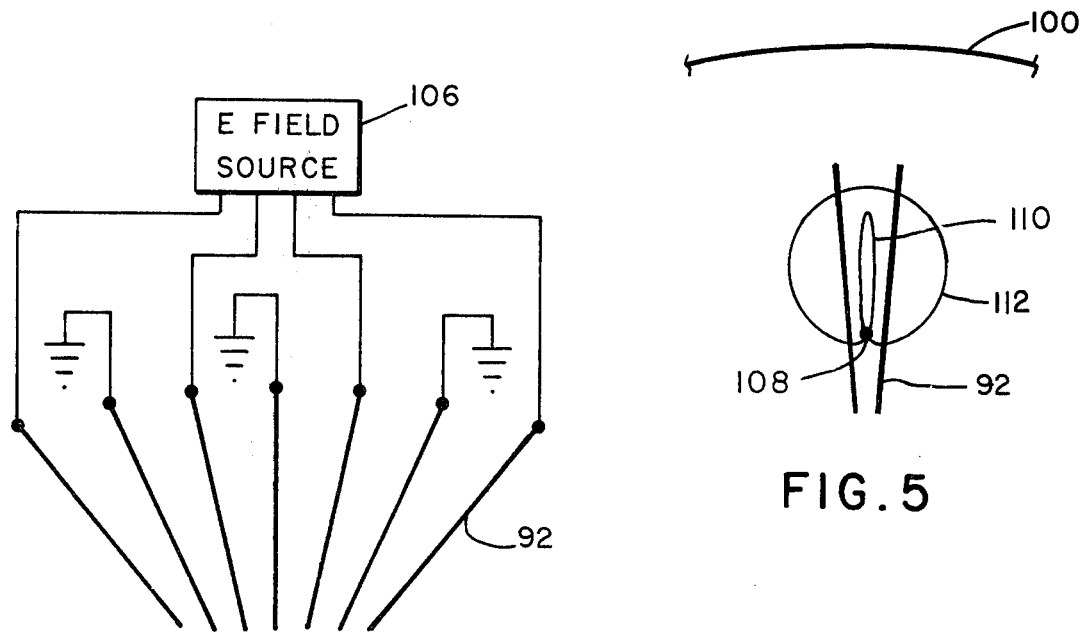
FIG. 4
FIG. 5

METHOD AND APPARATUS FOR THE SEPARATION OF ISOTOPES

CROSS-REFERENCE TO RELATED APPLICATION

This application is a continuation-in-part of our copending application Ser. No. 25,605, filed Mar. 25, 1970, now U.S. Pat. No. 3,772,519.

FIELD OF THE INVENTION

This invention relates to isotope separation and in particular to method and apparatus for separating ionized particles of one isotope type in a plasma, using super energetic electrons.

BACKGROUND OF THE INVENTION

Nearly all fission reactions utilizing the uranium isotope, $U_{235}$, require a concentration of the $U_{235}$ isotope greater than in the naturally occurring state. The process of enrichment whereby the concentration of $U_{235}$ in natural or depleted uranium is raised to a desired level has been achieved in the past by many techniques which generally operate to separate $U_{235}$ from the other uranium isotopes, chiefly $U_{238}$, on the basis of its slight chemical or mass difference. Enrichment according to these techniques often requires cascaded processing using a sequence of repeated applications of the same steps, each step providing a slight increase in the concentration of the desired $U_{235}$ isotope.

BRIEF SUMMARY OF THE INVENTION

In accordance with the present invention, a method and apparatus for isotope separation is disclosed which selectively excites particles of the desired isotope type in a plural isotope environment and from the excited particles generates a plasma of ions of that isotope type and super energetic electrons by application of energy substantially in excess of that needed to create ionization from the excited state. The super energetic electrons expand with a kinetic energy substantially greater than the thermal or background energy of the environment and carry with them the ionized particles of the desired isotope.

While the invention contemplates general application to many isotopes and particles in atomic, molecular or other form, a particular application is found in enrichment of the uranium isotope $U_{235}$. In such application, a vapor of elemental uranium is typically generated and beamed as a vapor flow into a region where radiant energy of precisely prescribed frequency and energy is applied to selectively excite the particles of $U_{235}$ without corresponding excitation of particles of other isotope types in the vapor environment. The excited $U_{235}$ particles are separated from the vapor flow by imparting energy to the particles in excess of that needed to ionize them. In particular, a plasma having ions of those particles and super energetic electrons is created.

The super energetic electrons will have an average kinetic energy substantially above that of the thermal or background energy in the vapor flow and will accordingly expand faster than the thermal expansion of the vapor flow. The ionized particles of the one isotope type will be influenced by plasma charge neutrality requirements to accompany the expanding, super energetic electrons so as to produce, in general, an ion expansion on substantially different trajectories from those of the vapor flow as a whole. The rapidly expanding ions may then be collected apart from the vapor flow because of their different velocity vectors. The ion trajectories may additionally be limited to predetermined expansion directions by the application of, for example, a constraining force field such as a magnetic field.

The remaining components of the vapor flow may also be collected on further plates placed in the path of the vapor flow with the result that two separate collections of particles are created, each of which is enriched in its respective isotope types.

DESCRIPTION OF THE DRAWINGS

These and other features of the present invention will be more clearly understood by reference to the detailed description of a preferred embodiment presented below for purposes of illustration, and not by way of limitation, and to the accompanying drawings of which:

FIG. 1 shows an energy level diagram representing typical energy steps used in the invention;

FIG. 2 is a diagrammatic view of apparatus for use in practicing the invention;

FIG. 3 is a further diagrammatic view of a sectioned portion of the apparatus of FIG. 2;

FIG. 4 is a diagrammatic representation of a modification to a portion of the apparatus of FIG. 3; and FIG. 5 is an illustration of geometric considerations for the invention;

DETAILED DESCRIPTION OF THE PREFERRED EMBODIMENT

The present invention contemplates a technique for separating isotopes in an environment of plural isotopes by selectively exciting particles of one isotope type and ionizing the excited particles to produce a plasma of ions and corresponding electrons. The electrons are made super energetic by which is meant they are given additional energy beyond what is required to ionize them from the excited particles. This additional energy causes the electrons to expand away from the environment and, because of space charge or plasma charge neutrality requirements, to pull with them the ions of the desired isotope, leaving behind a higher concentration, or enrichment, of the non-ionized isotopes and providing in the rapidly expanding ions a greater concentration of that one isotope.

In the description of the invention which follows, while specifically applied to the enrichment of the $U_{235}$ isotope of uranium, it is contemplated that the disclosed technique may be used for other isotopes and materials. Additionally, the particles separated may be atomic, molecular or of other form as found useful. In describing the invention, the term transition will generally refer to one or more energy steps for a particle. It is recognized that the technique of the present invention is useful to enrich or purify isotope concentrations in either of the two separated factions.

By specific reference now to FIG. 1, the mechanism employed in the present invention may be more fully understood. FIG. 1 is an energy level diagram having along the Y-axis a particle energy scale. The X-axis represents a ground energy level 12. In accordance with the technique of the present invention, excitation of $U_{235}$ particles in a uranium vapor flow is achieved to an intermediate energy level 14 through a transition 16 with radiant energy which will typically include one or more laser radiations tuned to selectively excite particles of the $U_{235}$ isotope type generally from the ground level 12 to the intermediate energy level 14 without corresponding excitation of other isotopes, chiefly the $U_{238}$ isotope of uranium.

In accordance with the present invention, the particles of $U_{235}$ are ionized from the intermediate level 14 to above the ionization level 18 with sufficient additional energy to produce a plasma of ionized $U_{235}$ particles and corresponding super energetic electrons having energies, which are chiefly kinetic energy, in excess of the level 18 by, in the exemplary case of $U_{235}$, approximately 1 electron-volt (ev). One may view this excess energy as imparting to the electrons of the plasma a kinetic energy of motion substantially above the thermal energy in the uranium vapor. The super energetic electrons will tend to expand as an electron cloud more rapidly than the uranium vapor as a whole is tending to expand from thermal effects. As long as the electrons are permitted to expand, over a distance which is large with respect to the plasma Debye length, the electrons will reach a point where the electric field forces between them and the ions will be no longer randomly distributed throughout the plasma but will tend to pull the ions out, establishing generally similar velocities for the electrons and the ions. By theoretical calculation, it may be determined that the velocity of this super energetic expansion of electrons and ions is proportional to the square root of the total excess energy supplied in reaching level 22.

Returning to FIG. 1, the mechanism for this expansion can be achieved in several ways. In one alternative manner, additional radiant energy may be applied to the vapor environment having the excited particles of the $U_{235}$ isotope in order to produce a transition 20 to an energy level 22 indicated as approximately 1 ev. above the ionization level 18. Higher or lower energies may be employed to release the electrons from the $U_{235}$ particles with sufficient momentum directed out of the environment to pull the $U_{235}$ ions out of environment as well. The energy difference between the levels 22 and 24 appears generally as a kinetic energy of the electrons and associated ions of $U_{235}$, an energy not shared by the other components of the vapor environment, the background energy and results in a different trajectory and a generally more rapid expansion of the $U_{235}$ ions away from the background remainder of the vapor.

This mechanism may alternatively be achieved through a technique also illustrated in FIG. 1, whereby a transition 26 from the intermediate energy level 14 raises the energy of the $U_{235}$ particles to the level 14 to the general vicinity of the ionized level 18 (slightly above or below). From this point, additional energy is supplied to the vapor to produce an energy increment 28 which raises the energy to the level 22, with the resulting more rapid particle expansion described above.

Apparatus useful in achieving separation by the process illustrated in FIG. 1 is shown pictorially in FIG. 2. There, a laser system 32 includes a lasing medium 34 which is tuned by a tuning system 36 as is known in the art to produce an output beam 38 of radiant energy having a predetermined narrow bandwidth of photon energy to achieve selective excitation of the $U_{235}$ isotope for the transition 16. Where necessary to limit the bandwidth of the laser radiation in beam 38 an etalon filter may be employed by the tuning system 36. For the example described here, $U_{235}$, there are many absorption lines which may be used to raise the energy of $U_{235}$ particles from generally the ground level 12 to the intermediate level 14. These may be found from textbooks or tables of the atomic spectra of uranium or in general for other elements. In the specific example of uranium, one source is LA 4501 *Present Status of the Analyses of the First and Second Spectral of Uranium (UI and UII) as Derived from Measurements of Optical Spectra;* Los Alamos Scientific Laboratory of the University of California, available from National Technical Information Service, U.S. Department of Commerce, 5285 Port Royal Road, Springfield, Va.

Returning to FIG. 2, the laser system 32 has an excitation system 40 which may comprise an additional laser used to produce a population inversion in the medium 34 for creating the lasing effect. A timing system 41 is activated by a timer 42 to initiate a pulse of laser radiation in the beam 38. The duration of the beam will typically be on the order of a substantial fraction of a microsecond and is determined by the properties of the system 32, and particularly lasing medium 34, as is well known in the art.

In particular application, the lasing medium 34 may comprise a solution of a lasing dye which provides a wide range of tunability in the specific output frequency of the beam 38 to enable the generation of the frequency and corresponding photon energy that may be desired. A dye laser of the "Dial-A-Line" type of the Avco Everett Research Laboratory, Everett, Massachusetts, a commercially available laser, may be employed for the lasing system 32.

The beam 38 is combined with a beam 44 of radiant energy provided by a second laser system 46 through a dichroic mirror 48 or other combining means to provide a composite beam 50. Laser system 46 may be a conventional laser providing the desired photon energy in the beam 44. A timer 42 activates both laser systems 32 and 46 for, in the typical case, simultaneous output pulses.

Once an energy has been selected for the transition 16, the transition 20 may be achieved by a transition energy corresponding to the difference between the levels 22 and 14. By way of specific example, if the absorption line for $U_{235}$ in the vicinity of 5027.4A is selected for transition 16, the transition 20 may be produced by energy in the vicinity of 2625A using 6.18 ev. as the ionization potential for uranium.

The beam 50 is applied to a vacuum chamber 52 through a long pipe 54 and through a transmissive window 56, typically optical quartz crystal. The pipe 54 is provided to prevent contamination of the window 56 by uranium vapor within the chamber 52. The beam 50 traverses the chamber 52 through an isotope collector 58 and exits through a further pipe 60 and window 62 where it may be applied to similar chambers for efficient use of the energy in the laser beam 50.

The chamber 52 is evacuated through a vacuum system 64 to provide a very low pressure within the chamber such that extraneous particles do not interfere with the processes of isotope separation as by combustion with the uranium vapor, particle collision, or otherwise.

Within the chamber 52, a uranium vapor source 66 operates to provide a beam of uranium vapor directed toward the isotope collectors 58 for generating the super energetic plasma which is then collected on plates within the collectors 58. A fuller view of the operation of the invention with respect to the vapor source 66 and collectors 58 can be seen from FIG. 3, which is a sectional view of the chamber 52.

Shown in FIG. 3, a crucible 68 (or plurality thereof) is provided with cooling ports 70 and contains a reservoir of uranium metal 72 which is heated for vaporization from a surface 74. The heating may be achieved by furnace or induction heating means or by the application of a beam 76 of energy such as electrons from a source 78. A single long beam may be magnetically focused to a line on surface 74 or a plurality of beams may be focused to corresponding spots at plural crucibles using local magnetic fields 82. The magnetic fields 82 may be shielded from the collectors 58, if necessary, to prevent interference with the collection process. The uranium evaporated from the surface 74 will expand in a vapor flow 88 toward the isotope collectors 58 and may be collimated by slits 90 before entering the collectors 58. Slits 90 may further serve as magnetic shielding.

Within the isotope collectors 58 a plurality of radial plates 92 run the length of the collectors 58 in FIG. 2 and are oriented toward the source of uranium vapor from the surface 74 to prevent obstruction of the flow 88. A region 94 surrounding the plates 92 defines the area of application of radiant energy in the laser beam 50 and may be shaped in a geometry other than the one shown. The dimension of the plates 92 in the radial direction is generally long with respect to their separation, while their separation is long with respect to the Debye length of the plasma to be generated in the region 94.

Application of the laser beam 50 according to the first alternative produces ionization of the $U_{235}$ isotope and provides in the region 94, a super energetic plasma consisting of electrons and associated ions. The excess energy produces more rapid expansion for the ions than the thermal expansion in the vapor flow 88. The generally more rapid expansion of the $U_{235}$ particles gives a net velocity to them which causes the build up of enriched $U_{235}$ deposits 96 on the plates 92. The remaining components of the vapor flow 88, typically enriched $U_{238}$, collects as deposits 98 on a plate 100 behind the radial plates 92. It is, of course, possible to exchange the $U_{235}$ and $U_{238}$ collections by exciting and ionizing $U_{238}$ instead.

With reference to FIG. 5, there is an illustration of the effect of super energizing the electrons which causes them to pull the ions onto trajectories distinct from the trajectories of the background particles. A particle 108 represents an atom of $U_{235}$ prior to ionization, and like the other particles of the vapor flow 88 can typically be viewed as having a velocity distributed somewhere about lobe 110 in the region between plates 92. After ionization of particle 108 and super energization of the electron emitted by that particle, the trajectory of particle 108 will be changed in response to the pull from the expanding electron cloud, so that its trajectory will lie at some angle governed by the distribution lobe 112. It can thus be seen that a substantial number of the particles ionized and changed in trajectory will be directed toward the plates 92 while nearly all non-ionized particles continue to be directed between plates 92 for collection on rear plate 100.

The closer the spacing of plates 92, the more ionized particles they will collect. A limiting factor on spacing indicates that plate spacing should not be so small that the super energetic electrons strike plates 92 before substantial changes in the ion trajectories are produced. It is also desirable that the mean free path and charge exchange distance in the plasma be sufficiently long that deflecting collisions or charge exchange reactions do not greatly impair the collection of ionized $U_{235}$ particles. To secure this result, the particle density in vapor flow 88 may be adjusted by controlling the energy applied to vaporize the uranium 72 in crucible 68.

The direction of motion in the super energetic expansion of electrons and ions in the region 94 can be constrained or limited in direction by application of a magnetic field in the region 94 between magnetic pole pieces 102 from excitation source 103 such that the more rapidly expanding particles follow trajectories generally parallel to the magnetic field lines between the poles 102. In using this magnetic field, it may be possible to use a lesser number of plates 92 or in fact to use only plates at either side of the region 94.

As previously indicated with reference to FIG. 1, the energy level 22 may be reached in an alternative manner through a transition 26 produced by radiant energy as from laser system 46 to an exemplary level 104 and by step 28 to level 22. In that case, the laser system 46 may be tuned to provide a lower frequency output in beam 44 with photon energies sufficient only to reach level 104, typically just above the ionization energy level 18. From this energy level 104, the final energy level 22, which produces the super energetic electrons and resulting ion expansion, may be produced in several ways. Energy may be applied to the ionized $U_{235}$ isotope and electrons by application of oscillating magnetic fields, for example, through magnetic pole pieces such as pieces 102 shown in FIG. 3. In addition, as shown in FIG. 4, an electric field or current may be provided in the region between the plates 92 by connecting alternate plates to a common or ground potential and supplying the remaining plates with electrical signals from a source 106. It is of course possible to employ external electrodes for generating the electric field or current within the region 94. Alternatively, source 106 may be a source of radiant energy that applies, for example, a microwave signal between plates 92 acting as a transmission line with absorption of the microwave energy by the plasma electrons to achieve the super energetic state. Additionally, particles such as electrons may be applied to raise the energy of the plasma charge carriers.

Having described above a preferred embodiment for the present invention, it will occur to those skilled in the art that further alternatives and modifications to the disclosed system can be devised within the spirit of the invention. Accordingly, it is intended to limit the scope of the invention only as indicated in the following claims.

What is claimed is:

1. In a technique for isotope separation, a process for generating a super energetic plasma of ionized particles of one isotope type and corresponding electrons in an environment of plural isotope types having a predetermined path of flow, said process including the steps of:
    applying radiant energy to said environment of plural isotopes including said one isotope type;
    the energy of said applied radiant energy corresponding to a selected transition for said particles of said one isotope type to produce excitation thereof to an intermediate excited level below the level of ionization without correspondingly producing excitation of other particles in said environment; and
    generating a plasma having ionized particles of said one isotope type and electrons released therefrom, the released electrons having a kinetic energy substantially in excess of the background energy of said environment to provide expansion of said electrons and resulting expansion of the ionized particles of said one isotope type in said environment onto trajectories distinct from the path of flow of the particles in said environment.

2. The process of claim 1 further including the step of collecting the expanding ionized particles of said one isotope type wihout correspondingly collecting the other particles of said environment.

3. The process of claim 2 wherein said collecting step is achieved with a plurality of collecting surfaces placed throughout said environment at orientations to intercept the expanding ionized particles of said one isotope type without substantial interception of the other components of said environment.

4. The process of claim 3 wherein:
said predetermined flow path permits passage of said particles through said collecting surfaces without substantial collection of neutral particles thereon except said expanding ionized particles of said one isotope type.

5. The process of claim 1 further including the step of applying a force to said expanding ionized particles to constrain their expansion direction generally along predetermined expansion directions.

6. The process of claim 5 wherein said force applying step includes the step of producing a magnetic field.

7. The process of claim 5 wherein collection surfaces are provided for the constrained expanding ionized particles of said one isotope type to provide collection thereof on said surfaces.

8. The process of claim 1 wherein said plasma generating step includes steps of:
applying second radiant energy to the excited particles of said one isotope type to produce ionization thereof; and
applying further energy to the plasma containing said ionized particles of said one isotope type and the corresponding electrons to produce a super energetic state having kinetic energies substantially above the background energy of said environment.

9. The process of claim 8 wherein said further energy includes a particle beam.

10. The process of claim 8 wherein said super energetic state is produced by the application of an electric current to said plasma.

11. The process of claim 8 wherein the step of producing said super energetic state includes applying third radiant energy to said plasma.

12. The process of claim 11 wherein said third radiant energy includes electromagnetic radiation.

13. The process of claim 8 wherein said super energetic state is produced by application of a force field to the elements of said plasma to increase their kinetic energy.

14. The process of claim 13 wherein said force field is oscillatory.

15. The process of claim 13 wherein said force field is an electric field.

16. The process of claim 13 wherein said force field is a magnetic field.

17. The process of claim 1 wherein said plasma generating step further includes the steps of:
applying further radiant energy to the environment containing said excited particles of said one isotope type to produce ionization thereof; and
establishing the photon energy in said applied further radiant energy to produce ionization of said selectively excited particles of said one isotope type and having sufficiently greater energy than that necessary to produce ionization so as to create said super energetic state in said plasma;
said super energetic state having associated therewith plasma kinetic energies significantly greater than the background energy of said environment to produce said more rapidly expanding ionized particles of said one isotope type.

18. In a technique for isotope enrichment, the process of separating particles of one isotope type in an environment containing a vapor flow of a material having plural isotope types with the flow velocity having a predetermined direction, said process including the steps of:
selectively exciting the particles of said one isotope type in said environment without correspondingly exciting the other particles of said plural isotopes in said environment;
imparting energy to the electrons of the excited particles of said one isotope type to substantially remove at least one electron from each particle of said one isotope type and impart to said removed electron a predetermined kinetic energy of motion substantially in excess of the background energy of said environment by an amount to cause said electrons to expand in generally all directions away from said environment with sufficient energy to change the trajectories of said ionized particles of said one isotope type from said predetermined direction; and
collecting said ionized particles of said one isotope from their changed trajectory path without correspondingly collecting the other particles of said plural isotopes of said environment.

19. A method for separating particles of one isotope type from an environment containing particles of plural isotope types flowing on a predetermined flow path, said method including the steps of:
selectively exciting particles of said one isotope type without correspondingly exciting particles of the other of said plural isotope types; and
generating a plasma by raising the energy of said excited particles by an amount substantially in excess of the amount necessary to cause ionization thereof to provide the corresponding released electrons with a super energized kinetic energy of motion substantially above the background energy of said environment with which they expand in generally all directions;
the super energized electron expansion creating a space charge separation with the ions resulting in the ions being changed in flow direction from the predetermined flow path to permit their collection apart from the other components of said environment.

20. The method of claim 19 wherein said one isotope type is uranium $U_{235}$.

21. The method of claim 20 wherein said generating step includes energizing said electrons approximately 1 electron-volt above the energy necessary for ionization.

22. Apparatus for separating particles of one isotope type from a flowing environment containing particles of plural isotope types on predetermined paths of flow, said apparatus comprising:

means for selectively exciting particles of said one isotope type without corresponding excitation of the particles of the other isotope type;

means for generating a plasma in said environment wherein the excited particles of said one isotope type are ionized and including means for generating a super energized state in released electrons imparting thereto a kinetic energy of motion substantially above the background energy of said environment whereby the electrons expand in said environment onto paths distinct from said predetermined paths with the result that said ions are changed in trajectory from their predetermined paths of flow;

means for collecting said ionized particles of said one isotope type by intercepting their changed trajectory without correspondingly collecting other particles of said plural isotopes of said environment.

23. The apparatus of claim 22 further including means for limiting the direction of the trajectories of said ionized particles of said one isotope type whereby those particles are constrained generally along predetermined directions.

24. The apparatus of claim 22 wherein said plasma generating means further includes:

means for applying further radiant energy to the excited particles of said one isotope type to produce ionization thereof and impart energy to the electrons released from said particles substantially in excess of the background energy of said environment.

25. The apparatus of claim 22 wherein:

said ionized particles of said one isotope type are on trajectories of a generally spherical expansion; and the collecting means includes a plurality of collection plates provided in said environment to intercept the generally spherical expansion of said ionized particles of said one isotope type over substantial angles of the expansion thereof.

26. The apparatus of claim 25 further including:

means for generating a vapor of material containing said plural isotopes to define said environment;

said generated vapor having the predetermined paths of flow substantially parallel to said plates to prevent collection on said plates of the constituents of said vapor other than the ionized particles of said one isotope type on said changed trajectories.

27. The apparatus of claim 22 wherein said means for generating a super energized state includes means for applying radiant energy to said plasma.

28. The apparatus of claim 27 wherein said radiant energy applying means includes means for applying a particle beam to said plasma.

29. The apparatus of claim 27 wherein said radiant energy applying means includes means for applying electromagnetic radiation to said plasma.

30. The apparatus of claim 22 wherein said means for generating a super energized state includes means for applying a force field to said plasma.

31. The apparatus of claim 30 wherein said force field applying means includes means for providing oscillations in the strength of said force field.

32. The apparatus of claim 30 wherein said force field applying means includes means for applying an electrical current to said plasma.

33. The apparatus of claim 22 further including means for vaporizing particles of plural isotopes of uranium to define said environment.

34. The apparatus of claim 22 wherein said means for generating a super energized state provides electrons having at least approximately one electron volt energy beyond the energy of releasing them from the particles of said one isotope type.

35. A process for isotope separation comprising the steps of:

generating a flowing environment of particles of plural isotope types of a material;

the flowing environment of said particles having predetermined flow paths with a generally uniform local direction thereto;

applying electromagnetic energy to the environment of particles of plural isotope types to selectively impart an amount of energy to particles of a selected isotope type which produces isotopically selective ionization of selected isotope type particles of said environment, the total energy imparted exceeding the ionization potential for the selected particles in said environment by an amount which results in the ionization of said selected particles and release of super energetic electrons therefrom having kinetic energies of motion greater than the background energy of particles in said vapor flow and with directions of motion distinct from the direction of said flow paths;

the released super energetic electrons causing the ionized particles of said environment to depart from the predetermined flow path onto distinct trajectories; and collecting ionized particles on the distinct trajectories apart from the other flowing particles of said environment.

36. The process of claim 35 wherein the kinetic energy of motion of the released electrons is at least approximately 1 electron volt.

37. A process for isotope separation comprising the steps of:

generating a flowing environment of particles of plural isotope types of a material;

the flowing environment of said particles having predetermined flow paths with a generally uniform local direction thereto;

applying electromagnetic energy to the environment of particles of plural isotope types to selectively ionize particles of a selected isotope type in said environment with the release of electrons from the selected isotope type particles;

super energizing the electrons in said environment to produce an electron expansion in generally all directions which results in space charge separation forces on the ions of the selected isotope type particles urging them onto trajectories distinct from the predetermined flow paths; and collecting the ionized particles on the distinct trajectories apart from the other particles of said environment.

38. The process of claim 37 wherein the super energizing step includes applying microwave radiation to the environment.

39. The process of claim 37 wherein the super energizing step includes applying an electric current to the environment.

40. The process of claim 37 wherein the super energizing step includes applying a particle beam to the environment.

41. The process of claim 37 wherein the super energizing step includes applying at least approximately 1 electron volt kinetic energy to said electrons.

* * * * *